(12) United States Patent
Bramian et al.

(10) Patent No.: US 8,957,642 B2
(45) Date of Patent: Feb. 17, 2015

(54) ENHANCEMENT MODE III-NITRIDE SWITCH WITH INCREASED EFFICIENCY AND OPERATING FREQUENCY

(75) Inventors: Tony Bramian, Torrance, CA (US); Jason Zhang, Monterey Park, CA (US)

(73) Assignee: International Rectifier Corporation, El Segundo, CA (US)

( * ) Notice: Subject to any disclaimer, the term of this patent is extended or adjusted under 35 U.S.C. 154(b) by 992 days.

(21) Appl. No.: 12/383,675

(22) Filed: Mar. 26, 2009

(65) Prior Publication Data

US 2009/0278513 A1 Nov. 12, 2009

Related U.S. Application Data

(60) Provisional application No. 61/050,730, filed on May 6, 2008.

(51) Int. Cl.
| | |
|---|---|
| *G05F 1/70* | (2006.01) |
| *H01L 27/06* | (2006.01) |
| *H01L 21/8258* | (2006.01) |
| *H03K 17/30* | (2006.01) |
| *H03K 17/567* | (2006.01) |
| *H03K 17/74* | (2006.01) |
| *H03K 17/687* | (2006.01) |

(52) U.S. Cl.
CPC ........ *H01L 27/0605* (2013.01); *H01L 21/8258* (2013.01); *H01L 27/0629* (2013.01); *H03K 17/302* (2013.01); *H03K 17/567* (2013.01); *H03K 17/74* (2013.01); *H03K 2017/6875* (2013.01)
USPC ........................................ 323/222

(58) Field of Classification Search
CPC .............................. H01L 27/06; H01L 29/872
USPC .......... 323/217–222, 271–282; 363/124, 132; 257/76, 78, 190, 192, 194, 201, 615, 257/140, 155, 392, 481; 327/380–382, 327/419–422, 493, 498–500, 504, 505, 570
See application file for complete search history.

(56) References Cited

U.S. PATENT DOCUMENTS 5,568,041 A * 10/1996 Hesterman .................... 323/207
7,116,567 B2 10/2006 Shelton (Continued)

OTHER PUBLICATIONS

Monolithically Integrated Enhancement/Depletion-Mode AlGaN/GaN HEMT Inverters and Ring Oscillators Using CF4 Plasma Treatmen, Sep. 2006 Yong Cai, Zhiqun Cheng, Wilson Chak Wah Tang, Kei May Lau, Fellow, IEEE,and Kevin J. Chen, Member, IEEE.*

*Primary Examiner* — Adolf Berhane
*Assistant Examiner* — Yemane Mehari
(74) *Attorney, Agent, or Firm* — Farjami & Farjami LLP

(57) ABSTRACT

According to one exemplary embodiment, an efficient and high speed E-mode III-N/Schottky switch includes a silicon transistor coupled with a D-mode III-nitride device, where the silicon transistor causes the D-mode III-nitride device to operate in an enhancement mode. The E-mode III-N/Schottky switch further includes a Schottky diode coupled across the silicon transistor so as to improve efficiency, recovery time, and speed of the E-mode III-N/Schottky switch. An anode of the Schottky diode can be coupled to a source of the silicon transistor and a cathode of the Schottky diode can be coupled to a drain of the silicon transistor. The Schottky diode can be integrated with the silicon transistor. In one embodiment the III-nitride device is a GaN device.

14 Claims, 6 Drawing Sheets

(56) References Cited

U.S. PATENT DOCUMENTS

| | | |
|---|---|---|
| 7,180,762 B2 | 2/2007 | Soldano |
| 7,276,883 B2 * | 10/2007 | Soldano ........................ 323/222 |
| 7,808,223 B1 * | 10/2010 | Khanna et al. ................. 323/272 |
| 7,825,435 B2 * | 11/2010 | Machida et al. ............... 257/195 |
| 7,902,809 B2 * | 3/2011 | Briere et al. .................. 323/351 |
| 7,948,220 B2 * | 5/2011 | Bahramian .................... 323/224 |
| 7,965,126 B2 * | 6/2011 | Honea et al. .................. 327/424 |

* cited by examiner

ENHANCEMENT MODE III-NITRIDE SWITCH WITH INCREASED EFFICIENCY AND OPERATING FREQUENCY

The present application claims the benefit of and priority to a provisional patent application entitled "Power Factor Correction Boost Circuit using Enhanced Mode III-Nitride Power Device," Ser. No. 61/050,730 filed on May 6, 2008. The disclosure in that provisional application is hereby incorporated fully by reference into the present application.

BACKGROUND OF THE INVENTION

1. Field of the Invention

The present invention is generally in the field of switching circuits. More particularly, the invention is in the field of high voltage switching circuits.

2. Background Art

High voltage circuits, such as power conversion circuits, typically require fast switches that are capable of handling high voltages without breaking down. Conventionally, silicon devices, such as high voltage silicon diodes and transistors, have been utilized to provide high voltage switches. For example, a high voltage silicon field effect transistor (FET), such as a high voltage metal oxide semiconductor FET (MOSFET), has been utilized as a high voltage switch in a power factor correction boost circuit.

When silicon devices, such as high voltage silicon diodes and transistors, are utilized as switches in high voltage circuits, such as power conversion circuits, they (i.e. the silicon devices) can store a large amount of charge when conducting current. When the silicon devices are turned off, the stored charge must be dissipated. However, the large amount of charge stored by the silicon devices, such as high voltage silicon diodes and transistors, can undesirably limit their efficiency and operating frequency. Consequently, the efficiency and operating frequency of high voltage circuits, such as power conversion circuits, can be undesirably limited by the use of silicon devices, such as high voltage silicon diodes and transistors, as high voltage switches.

SUMMARY OF THE INVENTION

Enhancement mode III-nitride switch with increased efficiency and operating frequency, substantially as shown in and/or described in connection with at least one of the figures, and as set forth more completely in the claims.

DETAILED DESCRIPTION OF THE INVENTION

The present invention is directed to an enhancement mode III-nitride switch with increased efficiency and operating frequency. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
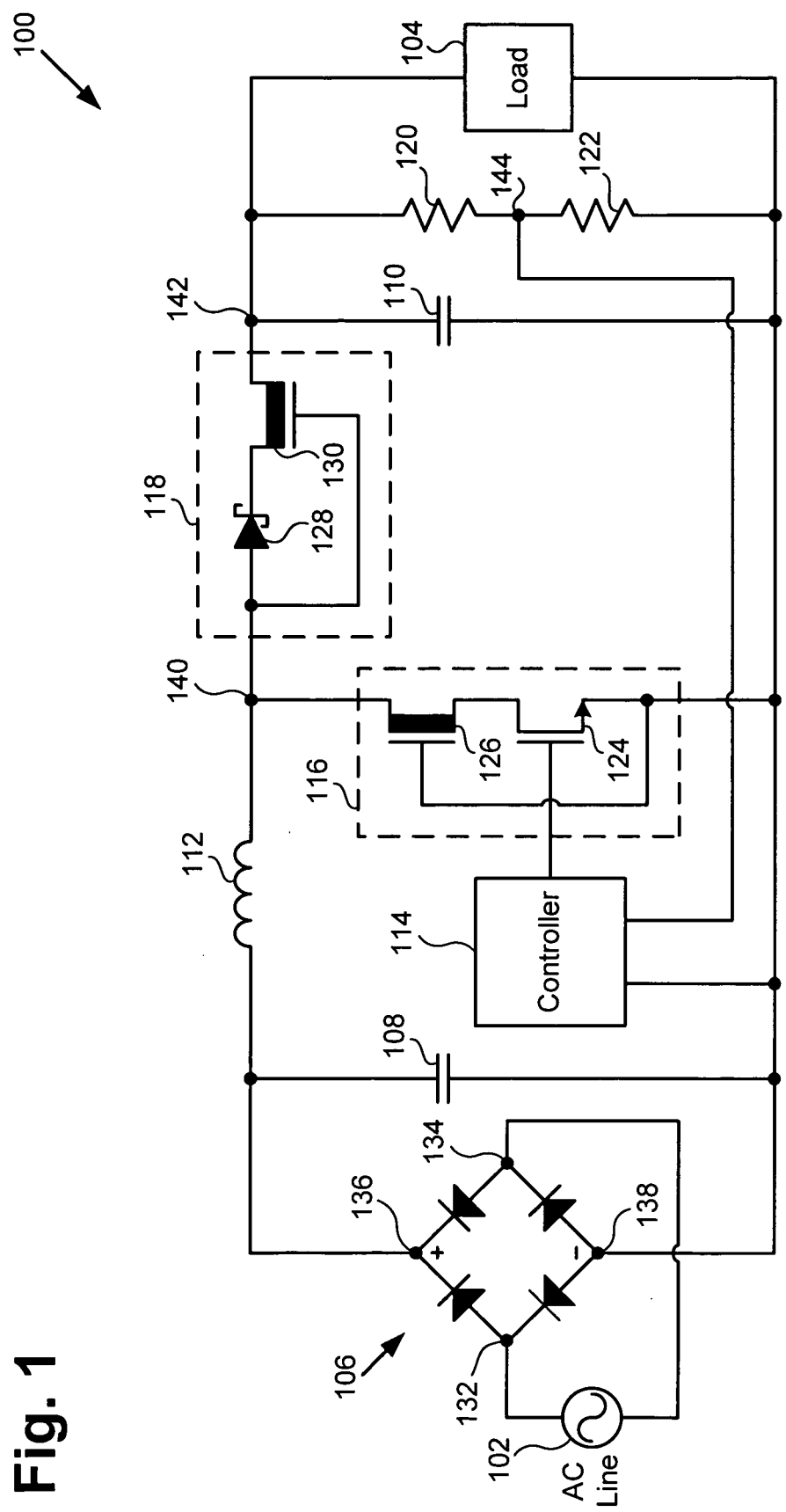
FIG. 1 illustrates a circuit diagram of a power factor correction boost circuit in accordance with one embodiment of the present invention.

FIG. 1 shows a circuit diagram of an exemplary power factor correction boost circuit coupled between an AC power source and a load in accordance with one embodiment of the present invention. Power factor correction (PFC) boost circuit 100 is coupled between AC power source 102, such as an AC line, and load 104 and includes full bridge rectifier 106, capacitors 108 and 110, inductor 112, controller 114, enhancement mode (E-mode) group III-nitride switch 116 (also referred to simply as "E-mode III-N switch" 116 in the present application), "normally off switch" 118, and resistors 120 and 122. E-mode III-N switch 116 includes silicon transistor 124 and depletion mode (D-mode) group III-nitride device 126 (also referred to simply as "D-mode III-nitride device" 126 in the present application) and normally off switch 118 includes Schottky diode 128 and D-mode III-nitride device 130. Load 104 can be, for example, a resistive load, an inductive load, such as a step-down transformer, or a capacitive load. Load 104 can be a load corresponding to a home appliance, such as a television set, for example.

As shown in FIG. 1, AC power source 102 is coupled to the inputs of full-bridge rectifier 106 at nodes 132 and 134, a first terminal of capacitor 108, which can be a filter capacitor, is coupled to a positive output of full bridge rectifier 106 and a first terminal of inductor 112, which can be a boost inductor, at node 136, and a second terminal of capacitor 108 is coupled to a negative output of full bridge rectifier 106 at node 138. Also shown in FIG. 1, a second terminal of inductor 112 is coupled to a first terminal of E-mode III-N switch 116 and a first terminal of normally off switch 118 at node 140 and a second terminal of E-mode 111-N switch 116 is coupled to the negative output of full-bride rectifier 106 at node 138.

In E-mode III-N switch 116, silicon transistor 124 is coupled in series with D-mode III-nitride device 126, wherein the gate of D-mode III-nitride device 126 is coupled to the source of silicon transistor 124 and the drain of silicon transistor 124 is coupled to the source of D-mode 111-nitride device 126. Silicon transistor 124 can be, for example, a low voltage silicon transistor, such as a silicon FET. In one embodiment, silicon transistor 124 can be a low voltage silicon MOSFET. D-mode III-nitride device 126 can comprise a group III nitride semiconductor compound, such as aluminum nitride (AlN), indium nitride (InN), gallium nitride (GaN), aluminum gallium nitride (AlGaN), indium gallium nitride (InGaN), or indium aluminum gallium nitride (InAlGaN). The aforementioned semiconductor compounds have a relatively wide direct bandgap that permits highly energetic electronic transitions to occur. D-mode III-nitride device 126 is a high voltage device and has reduced charge storage and a high mobility conduction channel, which enables it (i.e. D-mode III-nitride device 126) to conduct high current. As a result of reduced charge storage, D-mode III-nitride device 126 provides increased efficiency and increased operating frequency.

D-mode III-nitride device 126 is a normally on device. However, by coupling silicon transistor 124 in series with D-mode III-nitride device 126 as discussed above, silicon transistor 124 causes D-mode III-nitride device 126 to operate in an enhancement mode (E-mode). For example, when silicon transistor 124 is turned on, D-mode III-nitride device 126 is also turned on, thereby allowing current to flow through silicon transistor 124 and D-mode III-nitride device 126. When silicon transistor 124 is turned off, D-mode III-nitride device 126 turns off as a result of a voltage that develops across silicon transistor 124. By including the series-coupled combination of silicon transistor 124 and D-mode III-nitride device 126, E-mode III-N switch 116 provides reduced charge storage, thereby providing increased efficiency and increased operating frequency.

In normally off switch 118, Schottky diode 128 is coupled in series with D-mode III-nitride device 130. In particular, the anode of Schottky diode 128 is coupled to the gate of D-mode III-nitride device 130 and the cathode of Schottky diode 128 is coupled to the source of D-mode III-nitride device 130. Schottky diode 128 can be a low voltage silicon diode in an embodiment of the present invention. D-mode III-nitride device 130, which is a high voltage device, can comprise similar group III nitride semiconductor compounds and provides similar advantages as D-mode III-nitride device 126. D-mode III-nitride device 130 is a normally on device. However, by coupling Schottky diode 128 in series with D-mode III-nitride device 130 as discussed above, Schottky diode 128 causes D-mode III-nitride device 130 to turn off when it (i.e. Schottky diode 128) is in a reverse mode (i.e. when current flows from cathode to anode).

For example, in a forward mode (i.e. when current flows from anode to cathode), Schottky diode 128 is turned on and D-mode III-nitride device 130 is also turned on. The voltage drop across Schottky diode 128 in the forward mode has a negligible effect on D-mode III-nitride device 130, which is a high voltage device. In the reverse mode, D-mode III-nitride device 130 turns off as a result of a voltage that develops across Schottky diode 128. Thus, the combination of Schottky diode 128 and D-mode III-nitride device 130 can operate as a high voltage diode, where the anode of Schottky diode 128 can be an "anode" of the high voltage diode and the drain of D-mode III-nitride device 130 can be a "cathode" of the high voltage diode. By including the series-coupled combination of Schottky diode 128 and D-mode III-nitride device 130, normally off switch 118 provides reduced charge storage, thereby providing increased efficiency and increased operating frequency.

Further shown in FIG. 1, a second terminal of normally off switch 118 is coupled to first terminals of capacitor 110, which can be an output capacitor, resistor 120, and load 104, and second terminals of capacitor 110 and load 104 can be coupled to the negative output of full-bride rectifier 106 at node 138. Also shown in FIG. 1, a second terminal of resistor 120 is coupled to a first terminal of resistor 122 and a first input (i.e. a feedback input) of controller 114 at node 144 and a second terminal of resistor 122 is coupled to the negative output of full-bride rectifier 106 at node 138. Resistors 120 and 122 form a voltage divider, which provides a feedback signal to the feedback input of controller 114 at node at 144. Further shown in FIG. 1, an output of controller 114, which can be a PFC pulse width modulation (PWM) controller, is coupled to the gate of silicon transistor 124 and a second input of controller 114 is coupled to the negative output of full-bridge rectifier 106 at node 138. Controller 114 can be configured to control the on/off time of E-mode III-N switch 116 by providing a pulse width modulated signal to the gate of silicon transistor 124 to control the on/off time of silicon transistor 124.

During operation of PFC boost circuit 100, controller 114 provides a PWM (pulse width modulated) signal to the gate of silicon transistor 124 to control the on/off time of E-mode III-N switch 116. When E-mode III-N switch 116 is turned on, current flows in a loop including E-mode III-N switch 116 and normally off switch 118, thereby causing charge to be stored in E-mode III-N switch 116 and normally off switch 118. When E-mode III-N switch 116 is turned off, the stored charge stored in E-mode III-N switch 116 and normally off switch 118 needs to be dissipated. This stored charge, however, is significantly less than the stored charge if, in place of switches 116 and 118, conventional switches were used—which resulted in significantly limiting the efficiency and operating frequency of, for example, a conventional PFC boost circuit.

In a conventional PFC boost circuit, a high voltage MOSFET is typically utilized in place of E-mode III-N switch 116 and a high voltage silicon diode is typically utilized in place of normally off switch 118. However, the high voltage MOSFET stores significantly more charge than E-mode III-N switch 116 and the high voltage silicon diode stores significantly more charge than normally off switch 118. Thus, by utilizing E-mode III-N switch 116 and normally off switch 118, an embodiment of the invention's PFC boost circuit 100 can significantly reduce the amount of stored charge that needs to be dissipated compared to a conventional PFC boost circuit. By reducing the amount of stored charge that needs to be dissipated, E-mode III-N switch 116 and normally off switch 118 cause PFC boost circuit 100 to provide an increased efficiency and an increased operating frequency compared to the conventional PFC boost circuit.

Also, by operating at a higher frequency, PFC boost circuit 100 can utilize smaller sized passive components, such as capacitors and inductors, which can advantageously reduce the footprint of PFC boost circuit 100, thereby advantageously reducing manufacturing cost.

Figure 2:
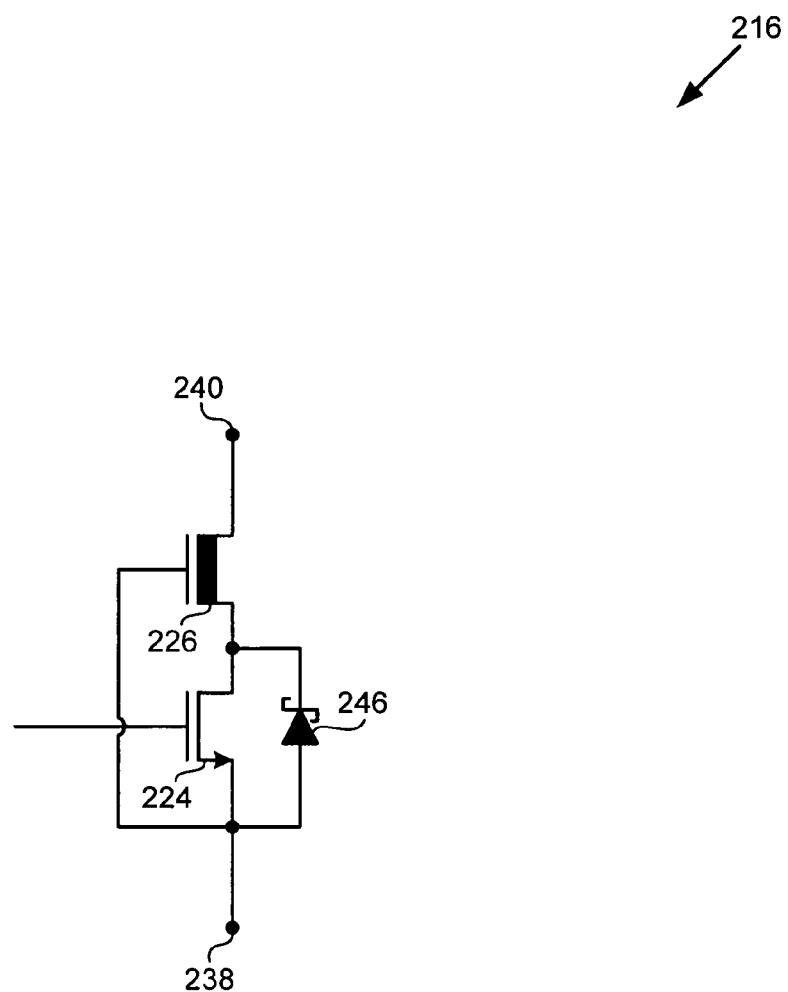
FIG. 2 illustrates a circuit diagram of an exemplary E-mode III-nitride/Schottky switch in accordance with one embodiment of the present invention.

FIG. 2 shows a circuit diagram of an exemplary E-mode III-nitride/Schottky switch in accordance with one embodiment of the present invention. In one embodiment of the present invention, E-mode III-nitride/Schottky switch 216 (also referred to simply as "E-mode III-N/Schottky switch" 216 in the present application) can be utilized in place of E-mode III-N switch 116 in FIG. 1. E-mode III-N/Schottky switch 216 includes silicon transistor 224, D-mode III-nitride device 226, and Schottky diode 246. In FIG. 2, silicon transistor 224 and D-mode III-nitride device 226 correspond, respectively, to silicon transistor 124 and D-mode III-nitride device 126 in E-mode III-N switch 116 in FIG. 1. Thus, silicon transistor 124 can be a low voltage silicon FET, such as a low voltage silicon MOSFET, and D-mode III-nitride device 226 can comprise a group III nitride semiconductor compound, such as aluminum nitride (AlN), indium nitride (InN), gallium nitride (GaN), aluminum gallium nitride (AlGaN), indium gallium nitride (InGaN), or indium aluminum gallium nitride (InAlGaN).

As shown in FIG. 2, silicon transistor 224 is coupled with D-mode III-nitride device 226 between nodes 238 and 240 and Schottky diode 246 is coupled across silicon transistor 224. In particular, the anode of Schottky diode 246 is coupled to the source of silicon transistor 224 and the gate of D-mode III-nitride device 226 and the cathode of Schottky diode 246 is coupled to the drain of silicon transistor 224 and the source of D-mode III-nitride device 226. Schottky diode 246 can be a low voltage silicon Schottky diode in an embodiment of the present invention. In one embodiment, Schottky diode 246 can be integrated with silicon transistor 224.

D-mode III-nitride device 226 is a normally on device. However, by coupling silicon transistor 224 with D-mode III-nitride device 226 as discussed above, silicon transistor 224 causes D-mode III-nitride device 226 to operate in an enhancement mode (E-mode). For example, when silicon transistor 224 is turned on, D-mode III-nitride device 226 is also turned on, thereby allowing current to flow through silicon transistor 224 and D-mode III-nitride device 226. When silicon transistor 224 is turned off, D-mode III-nitride device 226 turns off as a result of a voltage that develops across silicon transistor 224. By including the combination of silicon transistor 224 and D-mode III-nitride device 226, E-mode III-N/Schottky switch 216 provides reduced charge storage, thereby providing increased efficiency and increased operating frequency.

Schottky diode 246 also provides reduced charge storage, which provides increased efficiency and operating frequency. In addition, Schottky diode 246 provides reduced reverse recovery time (i.e. a faster reverse recovery). Thus, an embodiment of the invention's E-mode III-N/Schottky switch 216 provides a high speed, high voltage switch having reduced charge storage, which provides increased efficiency and operating frequency, and also provides a faster reverse recovery time. Thus, E-mode III-N/Schottky switch 216 can be advantageously utilized in high voltage applications, such as power conversion applications, to advantageously provide increased efficiency, increased operating frequency, and increased reverse recovery time compared to a high voltage silicon FET, such as a high voltage silicon MOSFET.

Figure 3:
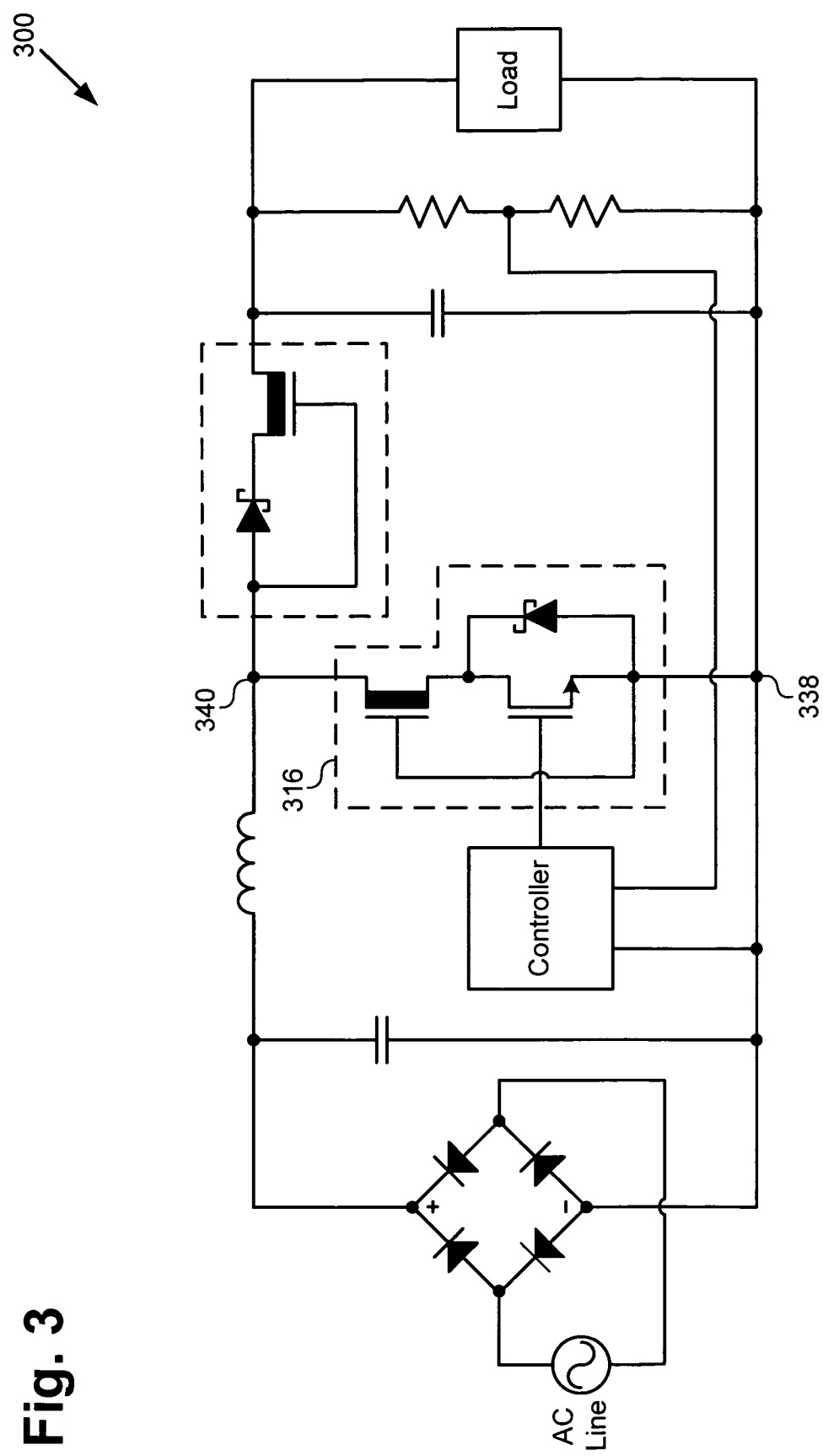
FIG. 3 illustrates a circuit diagram of a power factor correction boost circuit in accordance with another embodiment of the present invention.

FIG. 3 shows a circuit diagram of an exemplary power factor correction boost circuit coupled between an AC power source and a load in accordance with another embodiment of the present invention. PFC correction boost circuit 300 is substantially similar to PFC correction boost circuit 100 in FIG. 1, with a difference being that E-mode III-nitride/Schottky switch 316 (also referred to simply as "E-mode III-N/Schottky switch" 316 in the present application) in PFC correction boost circuit 300 is utilized in place of E-mode III-N switch 116 in PFC correction boost circuit 100. In FIG. 3, E-mode III-N/Schottky switch 316 corresponds to E-mode III-N/Schottky switch 216 in FIG. 2. By utilizing E-mode III-N/Schottky switch 316 between nodes 338 and 340 in place of E-mode III-N switch 116, an embodiment of the invention's PFC correction boost circuit 300 provides similar advantages as PFC correction boost circuit 100, such as increased efficiency and increased operating frequency. Also, the increased reverse recovery time provided by E-mode III-N/Schottky switch 316 can increase the operating speed of PFC correction boost circuit 300.

Figure 4:
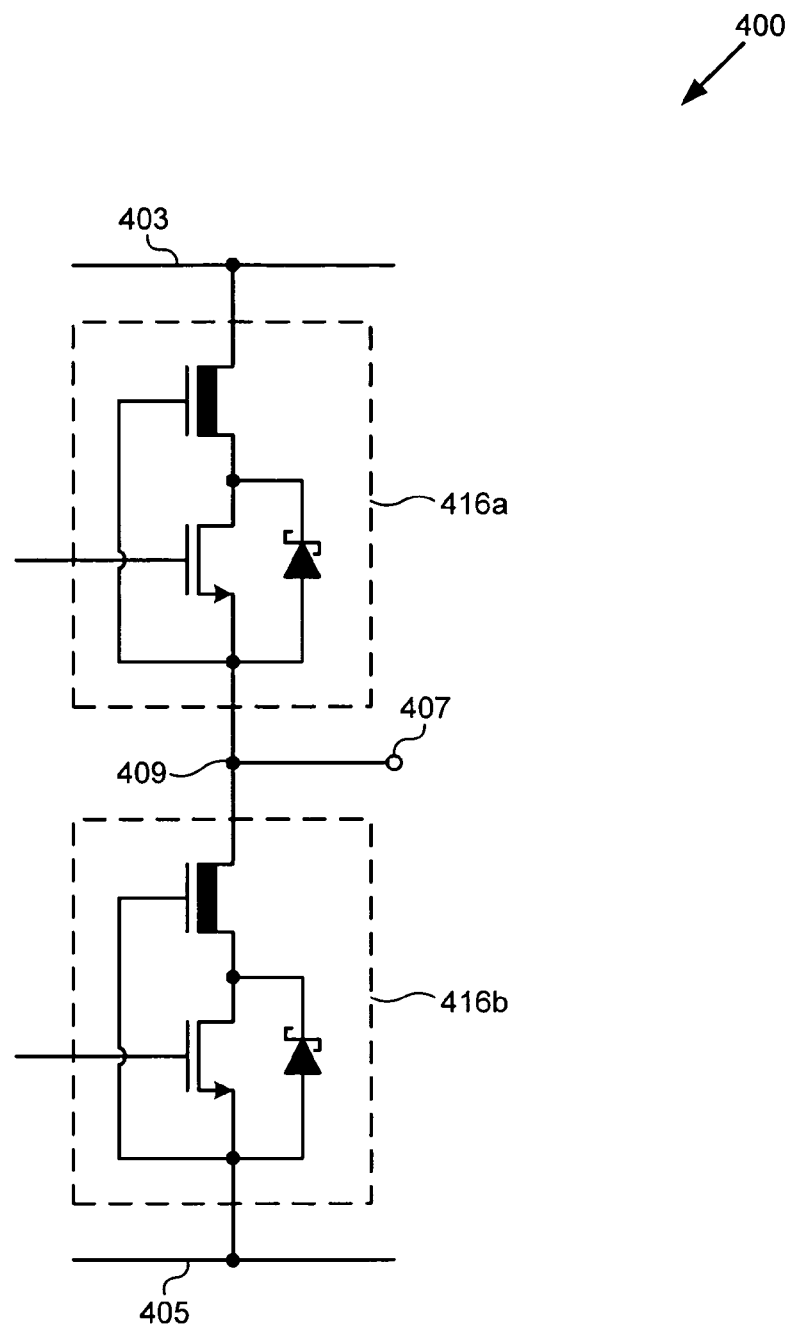
FIG. 4 illustrates a circuit diagram of an exemplary half-bridge configuration utilizing exemplary E-mode III-nitride/Schottky switches in accordance with one embodiment of the present invention.

FIG. 4 shows a circuit diagram of a half-bridge configuration in accordance with one embodiment of the present invention. Half-bridge configuration 400 includes E-mode III-N/Schottky switches 416a and 416b, which are coupled between supply voltage 403, which is a DC supply voltage, and ground 405. Each of E-mode III-N/Schottky switches 416a and 416b correspond to E-mode III-N/Schottky switch 216 in FIG. 2. Half-bridge configuration 400 includes output terminal 407, which is coupled to E-mode III-N/Schottky switches 416a and 416b at node 409. It is noted that half-bridge configuration 400 can also include other components, such as a controller, which are known in the art but not shown in FIG. 4.

By utilizing E-mode III-N/Schottky switches 416a and 416b, an embodiment of the invention provides a half-bridge configuration that advantageously provides increased efficiency and operating frequency and faster recovery time compared to a conventional half-bridge configuration that utilizes switches comprising high voltage silicon transistors, such as high voltage MOSFETs.

Figure 5:
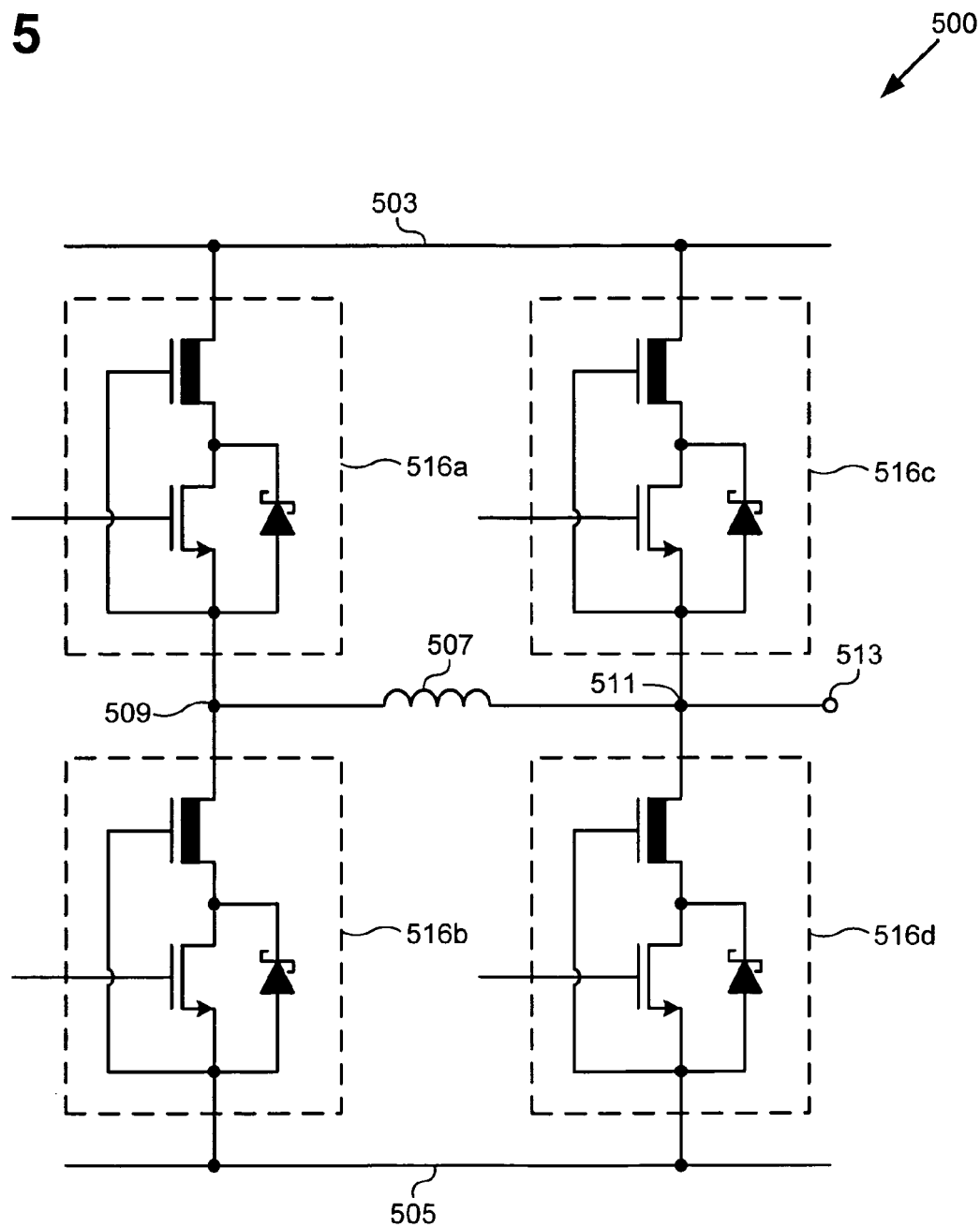
FIG. 5 illustrates a circuit diagram of an exemplary full-bridge configuration utilizing exemplary E-mode III-nitride/Schottky switches in accordance with one embodiment of the present invention.

FIG. 5 shows a circuit diagram of a full-bridge configuration in accordance with one embodiment of the present invention. Full-bridge configuration 500 includes E-mode III-N/Schottky switches 516a, 516b, 516c, and 516d, which are coupled between supply voltage 503, which is a DC supply voltage, and ground 505. Each of E-mode III-N/Schottky switches 516a, 516b, and 516d, correspond to E-mode III-N/Schottky switch 216 in FIG. 2. Full-bridge configuration 500 also includes inductor 507, which has a first terminal that is coupled to E-mode III-N/Schottky switches 516a and 516b at node 509 and a second terminal that is coupled to E-mode III-N/Schottky switches 516c and 516d at node 511. Full-bridge configuration 500 also has output terminal 513, which is coupled to node 511. It is noted that full-bridge configuration 500 can also include other components, such as a controller, which are known in the art but not shown in FIG. 5.

By utilizing E-mode III-N/Schottky switches 516a, 516b, 516c, and 516d, an embodiment of the invention provides a full-bridge configuration that advantageously provides increased efficiency and operating frequency and faster recovery time compared to a conventional full-bridge configuration that utilizes switches comprising high voltage silicon transistors, such as high voltage MOSFETs.

Figure 6:
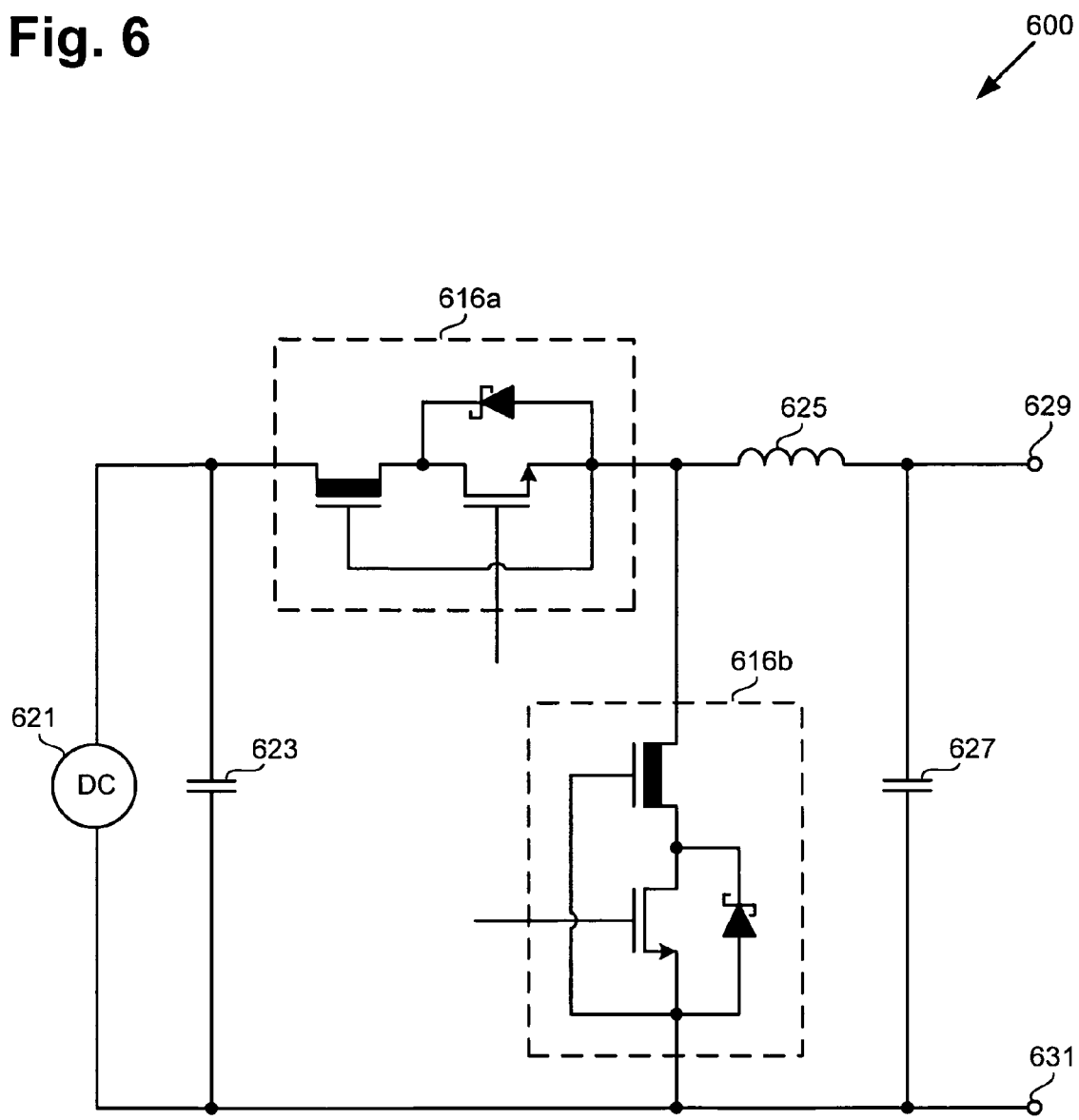
FIG. 6 illustrates a circuit diagram of an exemplary buck circuit utilizing exemplary E-mode III-nitride/Schottky switches in accordance with one embodiment of the present invention.

FIG. 6 shows a circuit diagram of a buck circuit in accordance with one embodiment of the present invention. Buck circuit 600 includes E-mode III-N/Schottky switches 616a and 616b, DC power supply 621, input capacitor 623, which is a filter capacitor, buck inductor 625, and buck capacitor 627, which is also a filter capacitor. In buck circuit 600, each of E-mode III-N/Schottky switches 616a and 616b correspond to E-mode III-N/Schottky switch 216 in FIG. 2. Buck circuit 600 has output terminals 629 and 631. Buck circuit 600 can also include a controller (not shown in FIG. 6) for controlling the on/off times of E-mode III-N/Schottky switches 616a and 616b.

As shown in FIG. 6, input capacitor 623 is coupled across DC power supply 621, E-mode III-N/Schottky switches 616a and 616b are coupled across input capacitor 623, and buck inductor 625 and buck capacitor 627 are coupled together across E-mode III-N/Schottky switch 616b. Buck circuit 600 can operate in a manner known in the art. By utilizing E-mode III-N/Schottky switches 616a and 616b, an embodiment of the invention provides a buck circuit that advantageously provides increased efficiency and operating frequency and faster recovery time compared to a conventional buck circuit that utilizes switches comprising high voltage silicon transistors, such as high voltage MOSFETs.

As discussed above, in FIG. 1, an embodiment of the invention's PFC boost circuit includes an E-mode III-N switch, which includes a silicon transistor coupled to a D-mode III-nitride device, and a normally off switch, which includes a Schottky diode coupled to a D-mode III-nitride device. As a result, the embodiment of the invention's PFC boost circuit provides increased efficiency and increased operating frequency compared to a conventional PFC boost circuit utilizing a high voltage silicon transistor, such as a high voltage MOSFET, and a high voltage silicon diode.

In FIG. 2, an embodiment of the invention's E-mode III-N/Schottky switch includes a silicon transistor coupled with a D-mode III-nitride device and a Schottky diode coupled across the silicon transistor. As a result, the embodiment of the invention's E-mode III-N/Schottky switch provides increased efficient and operating frequency and reduced reverse recovery time compared to a high voltage switch comprising a high voltage silicon transistor, such as a high voltage MOSFET.

In FIGS. 3, 4, 5, and 6, the invention's E-mode III-N/Schottky switch is utilized in a PFC boost circuit, a half-bridge configuration, a full-bridge configuration, and a buck circuit, respectively, thereby advantageously providing increased efficient and operating frequency and faster recovery time.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A power factor correction boost circuit comprising:
an E-mode III-N switch coupled across positive and negative outputs of a full-bridge rectifier, said E-mode III-N switch comprising a silicon transistor coupled in series with a D-mode III-nitride device, wherein a gate of said D-mode III-nitride device is connected to a source of said silicon transistor;
a normally off switch coupled to said E-mode III-N switch;
a controller configured to control an on/off time of said E-mode III-N switch;
said E-mode III-N switch and said normally off switch each having reduced charge storage, thereby causing said power factor correction boost circuit to have increased efficiency and operating frequency;
said E-mode III-N switch configured as a power switch in said power factor correction boost circuit.

2. The power factor correction boost circuit of claim 1, wherein said silicon transistor coupled in series with said D-mode III-nitride device causes said D-mode III-nitride device to operate in an enhancement mode.

3. The power factor correction boost circuit of claim 1, wherein said E-mode III-N switch further comprises a Schottky diode coupled across said silicon transistor, wherein said silicon transistor causes said D-mode III-nitride device to operate in an enhancement mode.

4. The power factor correction boost circuit of claim 1, wherein said normally off switch comprises a Schottky diode coupled in series with another D-mode III-nitride device.

5. The power factor correction boost circuit of claim 1 further comprising a boost inductor coupled between said positive output of said full-bridge rectifier and said E-mode III-N switch and said normally off switch.

6. The power factor correction boost circuit of claim 1 further comprising an output capacitor coupled between said normally off switch and said ground.

7. The power factor correction boost circuit of claim 2, wherein said D-mode III-nitride device is a GaN device and said silicon transistor is a low voltage FET.

8. The power factor correction boost circuit of claim 3, wherein said D-mode III-nitride device is a GaN device and said silicon transistor is a low voltage FET.

9. The power factor correction boost circuit of claim 4, wherein said another D-mode III-nitride device is a GaN device.

10. The power factor correction boost circuit of claim 6 further comprising a voltage divider coupled across said output capacitor, wherein said voltage divider provides a feedback signal to said controller.

11. An E-mode III-N/Schottky switch comprising:
a silicon transistor coupled with a D-mode III-nitride device, said silicon transistor causing said D-mode III-nitride device to operate in an enhancement mode;
a Schottky diode coupled across said silicon transistor;
said E-mode III-N/Schottky switch thereby achieving improved speed, efficiency, and reverse recovery time;
said E-mode III-N/Schottky switch configured as a power switch in a power conversion circuit;
wherein a gate of said D-mode III-nitride device is connected to a source of said silicon transistor, and wherein four of said E-mode III-N/Schottky switches are coupled between a supply voltage and a ground to form a full-bridge configuration.

12. The E-mode III-N/Schottky switch of claim 11, wherein a first and a second of said E-mode III-N/Schottky switches are coupled between said supply voltage and respective first and second terminals of an inductor and a third and a fourth of said E-mode III-N/Schottky switches are coupled between said respective first and second terminals of said inductor and said ground.

13. An E-mode III-N/Schottky switch comprising:
a silicon transistor coupled with a D-mode III-nitride device, said silicon transistor causing said D-mode III-nitride device to operate in an enhancement mode;
a Schottky diode coupled across said silicon transistor;
said E-mode III-N/Schottky switch thereby achieving improved speed, efficiency, and reverse recovery time;
said E-mode III-N/Schottky switch configured as a power switch in a power conversion circuit;
wherein a gate of said D-mode III-nitride device is connected to a source of said silicon transistor, and wherein a first said E-mode III-N/Schottky switch is coupled with a second said E-mode III-N/Schottky switch across a DC power source to form a buck circuit.

14. The E-mode III-N/Schottky switch of claim 13, wherein a buck inductor and a buck capacitor are coupled across said first said E-mode III-N/Schottky switch.

* * * * *